United States Patent [19]

Brestovansky et al.

[11] Patent Number: 5,210,959
[45] Date of Patent: May 18, 1993

[54] AMBIENT-FREE PROCESSING SYSTEM

[75] Inventors: Dennis F. Brestovansky, Danbury; Mark S. Nowotarski, Stamford, both of Conn.; Walter Plante, Auburn, Mass.

[73] Assignee: Praxair Technology, Inc., Danbury, Conn.

[21] Appl. No.: 746,755

[22] Filed: Aug. 19, 1991

[51] Int. Cl.[5] .......................... F26B 1/00; F26B 25/06
[52] U.S. Cl. .......................................... 34/22; 34/210; 432/11; 432/253
[58] Field of Search .............. 34/15, 22, 23, 210, 34/215, 216, 217; 432/5, 6, 11, 152, 239, 253

[56] References Cited

U.S. PATENT DOCUMENTS

| | | | |
|---|---|---|---|
| 4,376,225 | 10/1989 | Wagner et al. | 437/248 |
| 4,436,509 | 3/1984 | Kocmanek et al. | 432/253 |
| 4,526,534 | 7/1985 | Wollmann | 432/11 |
| 4,790,749 | 12/1988 | Mauro | 432/152 X |
| 4,823,680 | 4/1989 | Nowotarski | 98/36 |
| 4,911,638 | 3/1990 | Bayne et al. | 432/152 |
| 4,915,622 | 4/1990 | Witmer | 432/64 |
| 4,943,235 | 7/1990 | Nakao et al. | 432/6 X |
| 4,950,156 | 8/1990 | Philipossian | 432/253 |
| 4,955,808 | 9/1990 | Miyagawa | 432/5 |

Primary Examiner—Stephen M. Hepperle
Attorney, Agent, or Firm—Peter Kent

[57] ABSTRACT

An apparatus and method for processing a workpiece in an ambient-free, atmosphere of selected gas. A preparation vessel has an opening for entry of the workpiece and a diffuser oriented to emit across the vessel opening a laminar curtain flow of the selected gas which enters, purges the vessel and prevents the infiltration of air. The workpiece on its carrier is transported into the preparation vessel where air is purged out and replaced with selected gas. A processing vessel has a similar workpiece entry opening and diffuser. The preparation vessel and the processing openings are brought into coincidence, and the carrier is transported into the processing vessel for processing of the workpiece in the atmosphere of selected gas provided by the processing vessel diffuser.

29 Claims, 7 Drawing Sheets

AMBIENT-FREE PROCESSING SYSTEM

TECHNICAL FIELD

This invention relates to providing an ambient air-free atmosphere within processing vessels, in particular within processing vessels used in the manufacture of semiconductor devices.

BACKGROUND

Many of the manufacturing steps used to make semiconductor devices and integrated circuits require that a very high purity gaseous atmosphere be maintained within the vessel used for processing. Solid particles and vapor phase contaminants, notably moisture and oxygen, must be kept to an absolute minimum. Since these contaminants are contained in air, air infiltration into the vessel must be minimized.

Among the processes strongly affected by these contaminants is the annealing of titanium-coated silicon wafers in a nitrogen or argon environment to promote the formation of titanium silicide. As little as 1 to 5 ppm of oxygen and moisture can lead to the formation of undesirable titanium oxide. Similarly, the deposition of polysilicon onto exposed silicon on wafers to form bipolar emitter structures is very sensitive to oxidation of the exposed silicon. If air is initially present in the low pressure processing vessel, an oxide will form on the exposed silicon surfaces which can degrade device performance.

The extent of air infiltration into process vessels, the forces governing this phenomenon and the problems it can cause are not fully recognized in the integrated circuit industry. Most commercial semiconductor equipment is operated in batch or semibatch fashion. A load of one or more wafers is placed into a vessel, processed and unloaded. Measurements of the purity of the atmosphere within a wide variety of processing vessels during all phases of their operation reveal that typically considerable infiltration of room air into a processing vessel occurs during loading and unloading, which leads to detrimental contamination.

A processing vessel usually must be maintained at elevated temperature at all times because of the long times required for cooling and heating. The primary force for the influx of air into the vessel is the buoyancy difference between cool room air and the hot gases in the vessel. Hot gases in the vessel tend to rise toward the top of the vessel; cool room air flows in and down toward the bottom of the vessel through any openings in the vessel. Thus when a vessel is opened to admit or remove a workpiece, a large influx of room air occurs, and the atmosphere in the vessel becomes seriously contaminated.

In commercial practice, wafers are often placed in a boat on an open, motorized cantilevered carrier. When the processing vessel is opened, the carrier is transported into the processing vessel. As the wafers approach the processing vessel, the wafers are heated by radiant and convective heat transfer from the processing vessel. At this point, the wafers are still in a room air environment which is often deleterious to them as their temperature rises. Then, as wafers enter the processing vessel, they are exposed to still higher temperatures and to large concentrations of oxygen, moisture and particles which entered when the processing vessel was open.

Once the vessel is closed, the process gases begin to purge the airborne contaminants from the vessel. However, purging to levels below 100 ppm can take tens of minutes. As a result, process time is lost, equipment throughput decreases and capital costs per wafer processed increase.

The purging problem is even more severe for a low pressure or evacuated vessel. Here, moisture from infiltrating air adsorbs on the inner surface of the vessel and all other exposed components. Its removal under vacuum is difficult and slow.

SUMMARY OF THE INVENTION

An object of the present invention is to provide an improved apparatus and method for creating an ambient free atmosphere of selected gas in a processing vessel and a workpiece preparation vessel.

Another object is to provide an improved apparatus and method for processing semiconductor and integrated circuit components in an atmosphere of highly reduced ambient air concentration.

It is a feature of this invention to use a laminar fluid curtain flow to provide an atmosphere of selected gas within a vessel and to repress the infiltration of ambient air.

Advantages are that the invention provides an atmosphere of selected gas with reduced ambient air concentration within a reduced time compared to prior methods and apparatus.

The above objects, features and advantages are achieved by this invention in a system for processing a workpiece in a selected atmosphere, wherein the system comprises a processing vessel having an opening for entry of the workpiece, and a diffuser with an emitting surface oriented to emit a laminar curtain flow of selected gas across the processing vessel opening. The system further comprises a preparation vessel having an opening congruent with the processing vessel opening and a diffuser with an emitting surface oriented to emit a laminar curtain flow of selected gas across the preparation vessel opening. Included are means for bringing the preparation vessel opening and the processing vessel opening into coincidence and means for transferring the workpiece from the preparation vessel into the processing vessel when the preparation vessel opening and the processing vessel opening are in coincidence.

The means for transferring the workpiece comprises a carrier or boat which is loaded in the normal air atmosphere with the workpiece, and then transported into the preparation vessel which is at atmospheric temperature. Selected gas flow is then started from the diffuser at the opening of the preparation vessel thereby purging the preparation vessel of air. Thus air contacting the surfaces of the work is replaced with selected gas while the work is still at atmospheric temperature. Air is similarly purged from the diffuser at the processing vessel by selected gas emanating from the diffuser at the opening to the processing vessel. Upon bringing the openings of the preparation vessel and processing vessel into coincidence, the work is transferred into the processing vessel without a detrimental influx of atmospheric air into the system.

In another embodiment, the system comprises a processing vessel having an opening for entry of the workpiece, and a diffuser located within the processing vessel remote from the opening. The diffuser has an emitting surface oriented to discharge a laminar flow of a selected gas at a location intended for the workpiece during processing. The system further comprises a workpiece carrier or boat for retaining and carrying the workpiece into the workpiece opening in the processing vessel and means for supporting and transporting the carrier into the processing vessel.

A variant of this embodiment further comprises a trailing diffuser mounted on the carrier end intended to trail during entry of the carrier into the processing vessel. The diffuser is oriented to discharge away from the workpiece, has an emitting surface for issuing a laminar flow of selected gas, and is sized to fit within the processing vessel. This variant provides greater protection against the infiltration of air into the processing vessel.

In yet another embodiment, the carrier has a leading diffuser oriented to discharge at the intended workpiece location and a trailing diffuser oriented to discharge away from the intended workpiece location. The carrier, the diffusers and the work are sized to fit within a processing vessel. The selected gas flow from the diffusers purges the surfaces of the work before transportation of the work into the processing vessel, and maintains an atmosphere of selected gas within the processing vessel upon transportation into the vessel.

DETAILED DESCRIPTION OF THE INVENTION

Figures 1A, 1B:
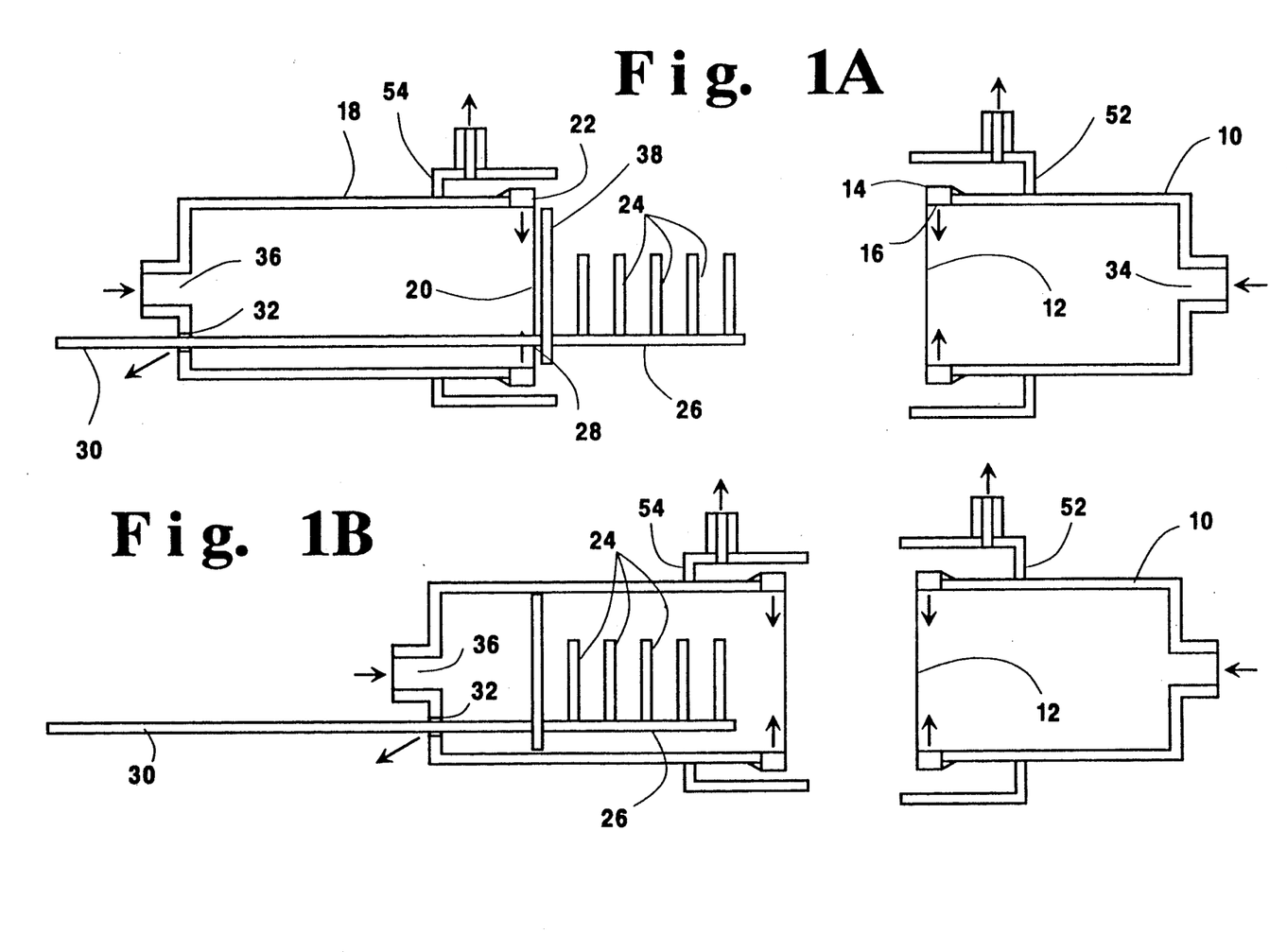
FIGS. 1A through 1E are vertical sectional views showing an embodiment of the apparatus comprising the invention during various stages of operation.

Turning now to the drawings, depicted in FIG. 1A through FIG. 1E is an embodiment of a novel apparatus for processing of a workpiece in a selected atmosphere. In FIG. 1A is shown a processing vessel 10 having an opening 12 for a workpiece. Adjacent to the opening is a diffuser 14 with an emitting surface 16 oriented to emit a laminar curtain flow of selected gas across the process vessel opening 12. The diffuser gas enters the processing vessel through the opening, purges the vessel of atmospheric air and prevents atmospheric air from entering, thereby providing an atmosphere of selected gas within the processing vessel. A selected gas may be an inert gas or a process or reactant gas or mixtures thereof.

A common processing vessel to which this invention is particularly suited is a furnace tube. A vessel opening may also be provided with a closure so that the vessel may be operated under pressure or under vacuum. When the closure is open, the diffuser performs the functions described.

Also provided is a preparation vessel 18 having an opening 20 congruent with the processing vessel opening 12. Adjacent to the preparation vessel opening 20 is a diffuser 22 with an emitting surface 23 oriented to emit a laminar curtain of selected gas across the preparation vessel opening. The diffuser at the opening of the preparation vessel also emits selected gas which enters the preparation vessel, purges it of atmospheric air and prevents atmospheric air from entering, thereby providing an atmosphere of selected gas in the preparation vessel.

Exhaust collectors 52 and 54 serve to collect the exhaust gas and are described more fully later.

The workpiece or workpieces 24 are retained on a carrier 26 or boat which is loaded with the work or unloaded while the carrier is in the position shown in FIG. 1A. The carrier 26 and the workpieces 24 are sized to enter the workpiece openings 12, 20 in the preparation and processing vessels. Typically, attached to the end of the carrier 26 intended to trail upon entry of the carrier into the processing vessel is an arm 30 which supports the carrier in a cantilever fashion. The arm protrudes through a port 32 in the end of the preparation vessel remote from the workpiece opening. By manipulation of the arm through the port, the carrier with its workpiece is transported into the preparation vessel and subsequently into the processing vessel. Typically a clearance is provided between the arm 30 and the port 32 to avoid rubbing contact and the generation of particles. However, in certain cases a seal is provided.

Optionally an inlet 34 may be provided in the processing vessel at the end remote from the workpiece opening. Selected gas may be admitted through this inlet to assist in purging and maintaining the atmosphere within the preparation vessel. A similar inlet 36 for selected gas may be provided in the preparation vessel.

Figure 1C:
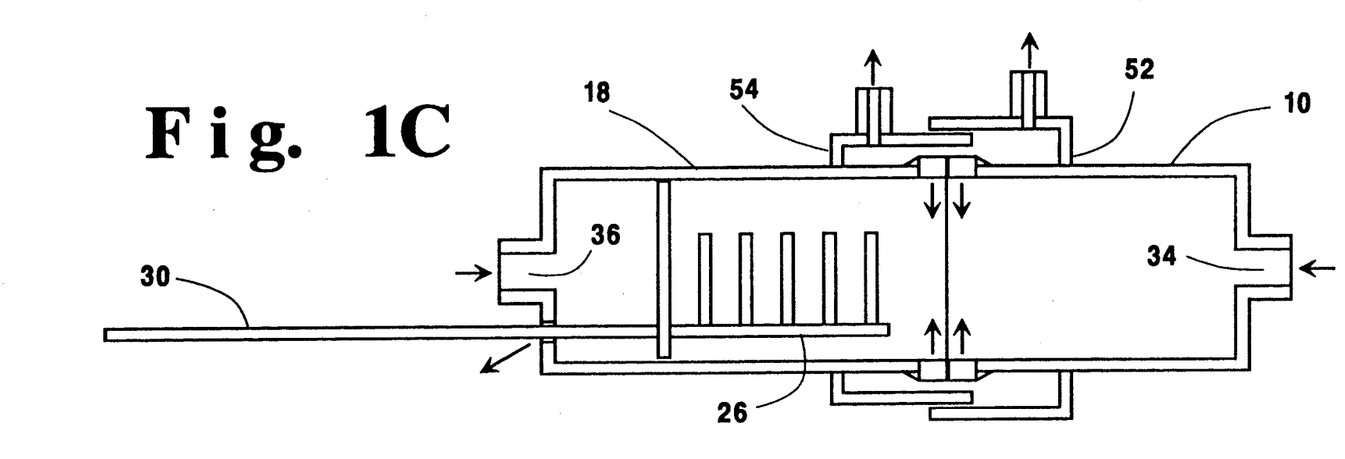
Figure 1D:
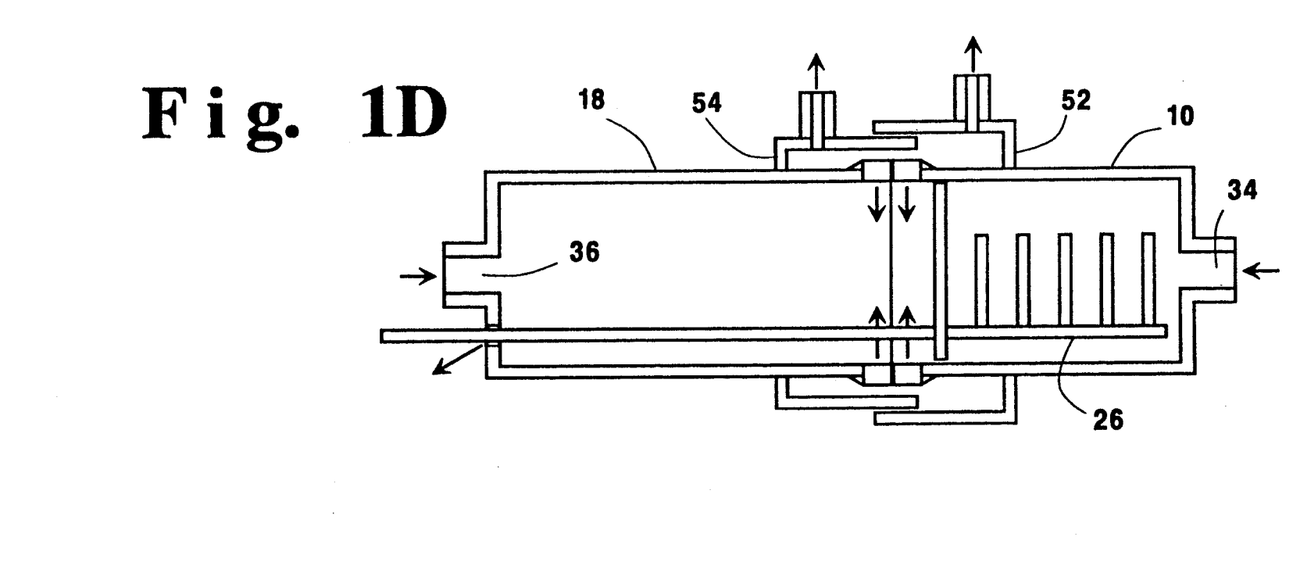
Figure 1E:
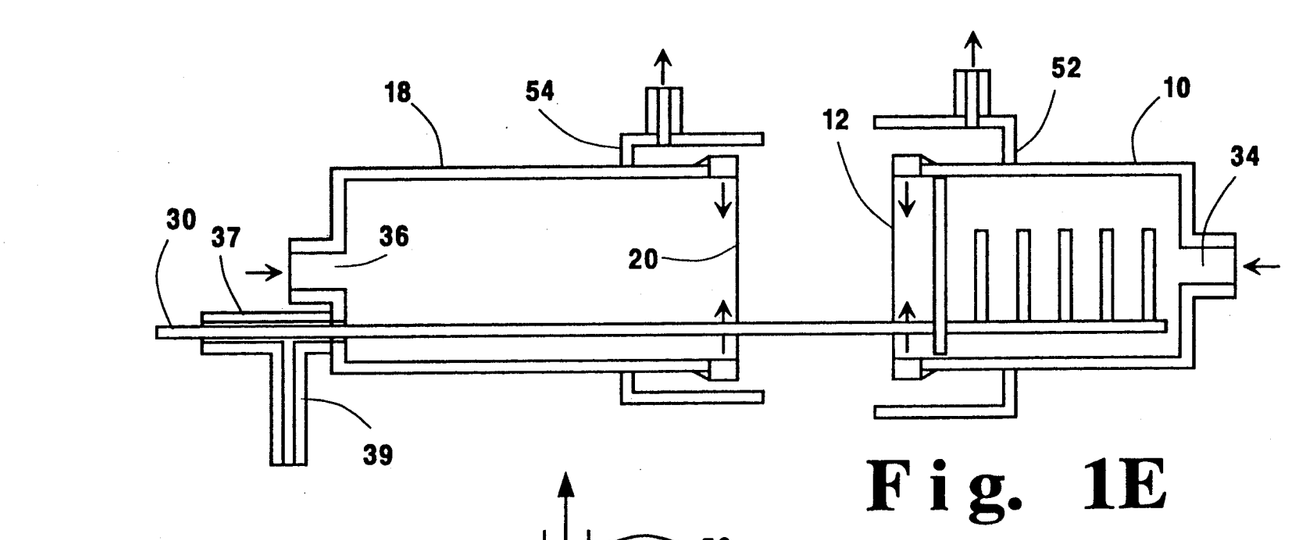

A preferred configuration for introducing selected gas into a preparation vessel at the end remote from the workpiece opening is shown in FIG. 1E. The configuration comprises a short carrier-arm tube 37 mounted in an end wall of the preparation vessel. The carrier-arm tube 37 desirably protrudes from about 0.1 to about 3 carrier-arm tube diameters into the preparation vessel, and extends from about 2 to about 10 diameters outside the preparation vessel. The carrier arm 30 passes through and is movable within the carrier-arm tube 37. The inside diameter of the carrier-arm tube 37 is sufficiently larger than the diameter of the carrier arm to avoid rubbing contact which might generate particles which could enter the preparation and processing vessels and degrade the work. An entry for selected gas supply into the carrier-arm tube 37 is provided by another tube 39 inserted into tube 37 near the end wall of the preparation vessel. A portion of the supplied selected gas flows out of the carrier-arm tube into the atmosphere while a larger portion flows into the preparation vessel. This preferred configuration is more efficient in purging the preparation vessel of air then the configuration comprising openings 36 and 32 shown in FIG. 1A.

FIG. 1B depicts the workpiece carrier within the preparation vessel. Selected gas flows from the diffuser at the preparation vessel opening and the gas inlet at the end of the preparation vessel then purge the interior of the preparation vessel. Thus the work is provided an atmosphere of selected gas while at atmospheric temperature and without any deleterious heating of the work in air.

Prior to coinciding preparation and processing vessel openings, selected gas flows from the diffuser at the opening of the processing vessel and the inlet at the end are initiated to purge the processing vessel interior. Then as shown in FIG. 1C, the preparation vessel opening is brought into coincidence with the processing vessel opening. With the two vessels in this position, the workpiece in the preparation vessel may be preheated by heat transfer from the processing vessel. Since an atmosphere of selected gas exists in both the processing and preparation vessel, preheating of the work in air is avoided.

The workpiece carrier is then transferred into the processing vessel by the arm extending from the carrier into the processing vessel as shown in FIG. 1D. The end 28 of the carrier 26 intended to trail upon entry of the carrier into the processing vessel is provided with an end plate 38 which serves to at least partially or substantially close the opening 12 to the processing vessel. This allows the flow of selected gas necessary to maintain the selected atmosphere within the processing vessel to be reduced or ceased. As shown in FIG. 1E, the preparation vessel may be drawn away from the processing vessel leaving the workpiece within the processing vessel for processing. Selected gas flow may then be altered if desired, for instance from an inert gas flow to a processing gas flow.

Figure 2:
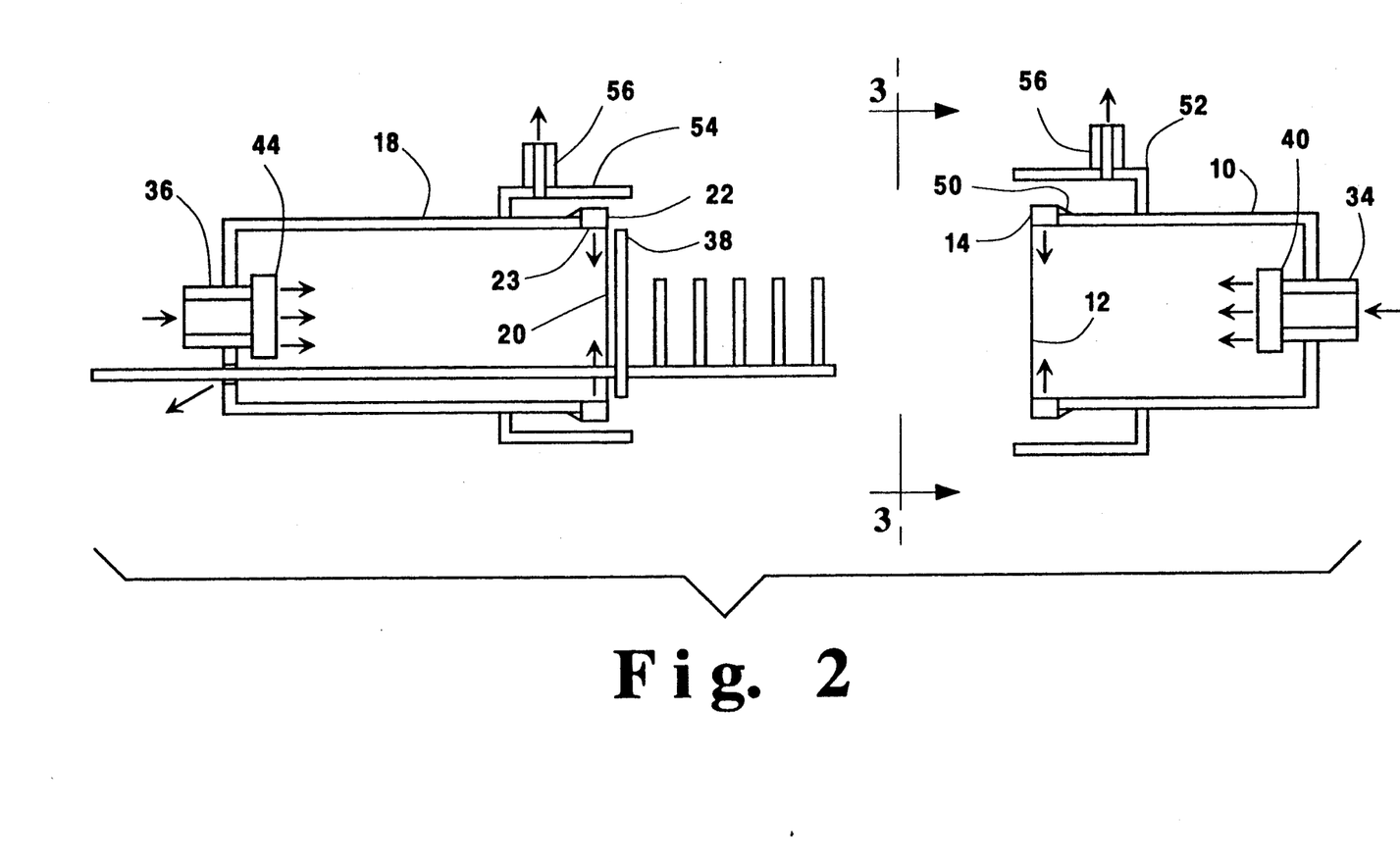
FIG. 2 is a vertical sectional view of a variant of the embodiment shown in FIG. 1.

In FIG. 2 is depicted an optional configuration for the introduction of selected gas at the end remote from the workpiece opening of the processing vessel. The selected gas is introduced through an internal diffuser 40 oriented to direct a laminar flow of selected gas within the processing vessel across the intended workpiece location and toward the workpiece opening. The use of an internal diffuser is more efficient in enveloping the workpiece and preventing the infiltration of air into the processing vessel than discharging selected gas from a wall port or a tube within the processing vessel. Lower levels of air concentration within a vessel may be achieved. The preparation vessel is similarly equipped with an internal diffuser 44 at the end remote from the workpiece opening.

Figure 5:
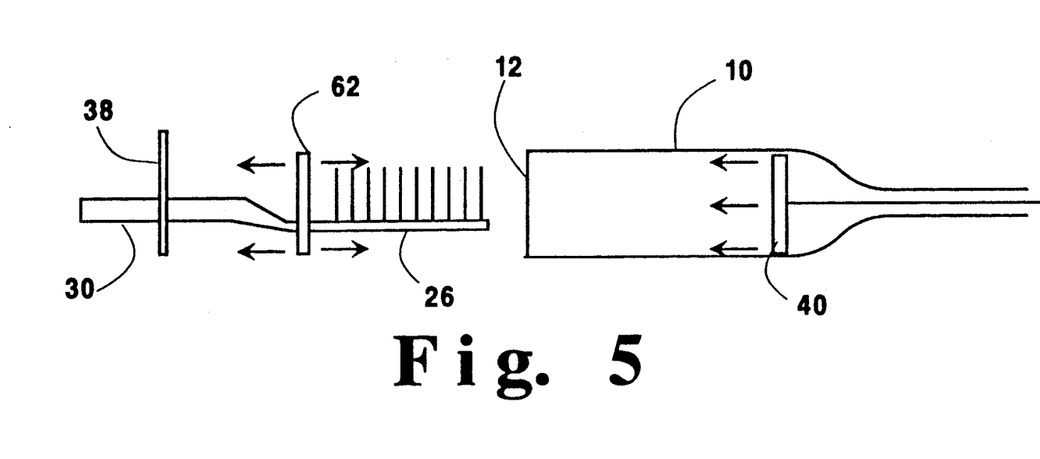
FIG. 5 and FIG. 6 are vertical sectional views of other embodiments of the invention.
Figure 6:
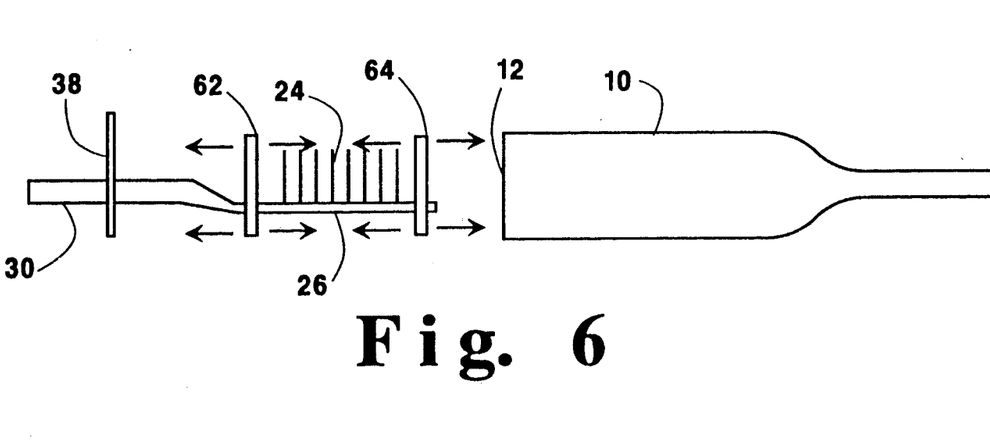

A diffuser within a vessel as diffuser 40 in FIG. 5, or mounted on a carrier as diffuser 62, 64 in FIG. 6 may have an emitting surface in the form of an annulus, a circle, a disk or other plane geometric figure.

Figure 3:
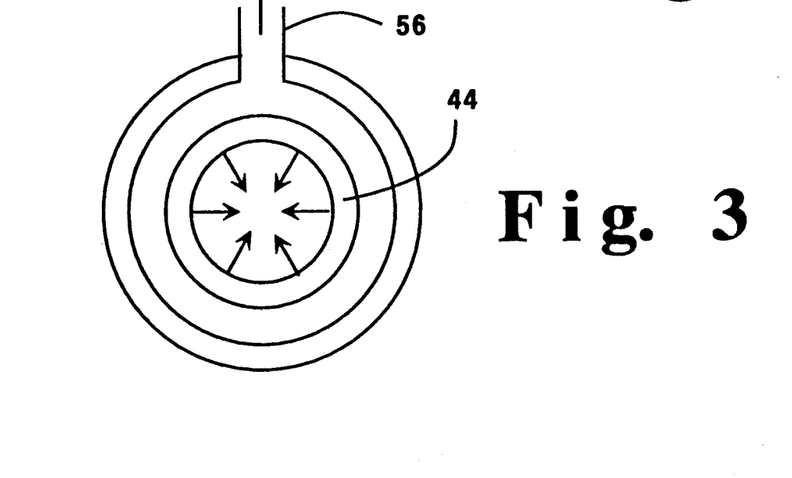
FIG. 3 is an end view of the apparatus in FIG. 2 taken in a direction of the arrows labeled 3—3.

As shown in FIG. 3, a diffuser at the opening of a vessel may have the form of an annulus 44 or a portion of an annulus. The emitting surface of an annular diffuser emits fluid to flow radially inward across the protected opening.

Figure 4:
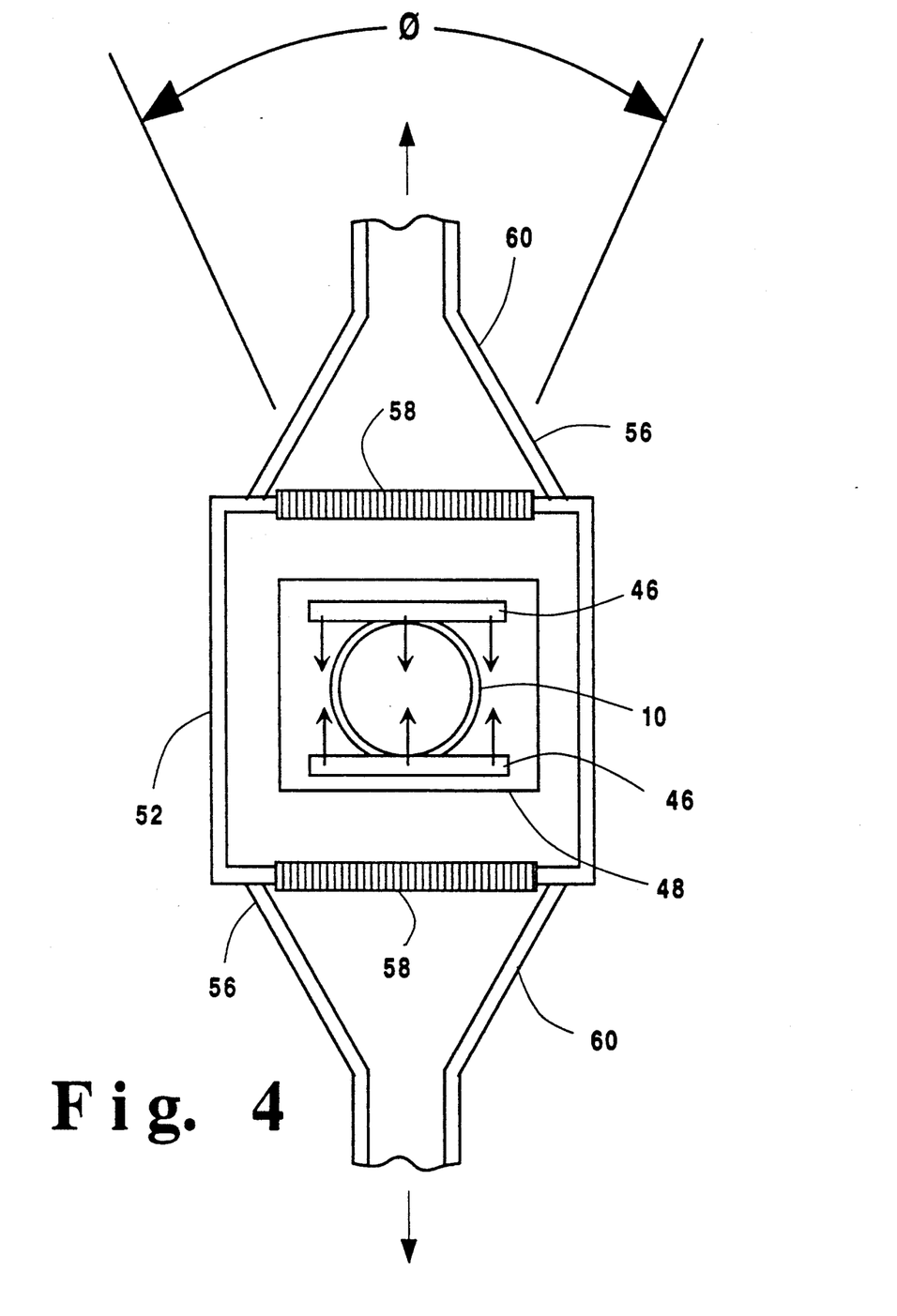
FIG. 4 is also an end view of a variant of the apparatus in FIG. 2 taken in the direction indicated by arrows 3—3, and showing a variation of the diffuser configuration which may be employed in this invention.

Alternatively as shown in FIG. 4, a diffuser at the opening of a vessel may have the form of a linear segment 46 positioned adjacent to an opening. The diffuser emitting surface is oriented to direct a flow of fluid across the opening to be protected. A single segment, or two segments positioned diametrically opposite each other across the opening may be employed. Four segments surrounding the opening may also be employed. The diffuser segments may be mounted on a plate 48 which is mounted al the vessel opening.

Preferably a diffuser at a vessel opening is mounted so that no void or gap exists between the diffuser housing and the perimeter of the vessel opening. Thus any gap between an annular diffuser housing and the surface where the diffuser is mounted is closed by a barrier or seal 50 to prevent induced flow of atmospheric air into the fluid curtain as shown in FIG. 2. As shown in FIG. 4, a diffuser having the form of a linear segment may be conveniently mounted on a plate 48 which has an aperture whereby the plate fits around the vessel at the vessel opening. Seals are provided between the plate 48 and the diffuser housing 46 and between the plate 48 and the vessel 10. The plate 48 and the seals eliminate any gaps and provide a barrier to the induced flow of air between a diffuser housing and the vessel.

Since the selected gas emanating from a diffuser might not contain oxygen and thereby pose an asphyxiation hazard, it is desirable to prevent the escape of such selected gas into a room. Thus, encompassing the diffuser at the processing vessel opening is an exhaust collector 52 to collect the selected gas discharging from the diffuser 14 and from the opening 12 of the processing vessel 10. Also encompassing the diffuser 22 at the opening 20 of the preparation vessel 18 is a similar exhaust collector 54 which serves to collect the gases emanating from the diffuser 22 and the preparation vessel.

An exhaust collector as shown in FIG. 3 may be a segment of duct having a circular cross section, or as shown in FIG. 4, a segment having a rectangular or square cross section. The gas collected in an exhaust collector is ducted away through a withdrawal port 56 in the side of the exhaust collector. A slight vacuum is maintained on the exhaust port. In some circumstances, the collected exhaust gas is reprocessed and reused.

A preferred port configuration which reduces the disturbance of a fluid curtain by exhaust withdrawal is shown in FIG. 4. The port comprises a flow resistive media 58, through which the exhausting gas is drawn into a tapering area duct 60. The flow resistive media may, for example, comprise a mesh, a porous plate or a narrow slot. The frontal area extended by the flow resistive media preferably extends over at least a 45° angle lying in the plane of the vessel opening with the angle vertex at the center of the opening. Two withdrawal ports diametrically across the vessel opening further reduce the disturbance of the fluid curtain. Most preferably, the flow resistive media in an exhaust collector extends 360° around the vessel opening.

In another embodiment depicted in FIG. 5, the apparatus comprises a processing vessel 10 having an opening 12 for the entry of the workpiece 24 and an internal diffuser 40 located within the processing vessel remote from the opening. The internal diffuser is oriented to discharge a laminar flow of gas across a location intended for the workpiece during its processing. Also comprising the apparatus is a workpiece carrier 26 for retaining and carrying the workpiece into the opening 12 of the processing vessel 10.

A trailing diffuser 62 is mounted on the carrier end intended to trail during the entry of the carrier 26 into the processing vessel 10. The trailing diffuser 62 is oriented to discharge a laminar flow of gas away from the workpiece, and, when within the processing vessel, towards the workpiece opening in the processing vessel. In this way the trailing diffuser prevents the infiltration of air into the processing vessel. In a variant of this embodiment, the trailing diffuser 62 is oriented to discharge a laminar flow of selected gas at the intended workpiece location on the carrier. In yet another variant, selected gas flow emanates from both faces of the trailing diffuser.

For supporting and transporting the carrier 26, an arm 30 extends from the trailing end of the carrier. Mounted on the arm 30, near the trailing end of the carrier 26, is an end plate 38 sized to at least partially close the opening 12 in the processing vessel when the carrier is within the vessel.

Yet another embodiment of the apparatus is depicted in FIG. 6. This embodiment comprises a processing vessel 10 having an opening 12 for the entry of the workpiece 24, and a workpiece carrier 26 for retaining and carrying the workpiece through the opening in the processing vessel. A leading diffuser 64 is mounted on the carrier end intended to lead during entry of the carrier into the processing vessel. The leading diffuser is oriented to discharge a laminar flow of selected gas at the intended workpiece location so as to envelop the workpiece and free the external surfaces of the workpiece of air before introducing the workpiece into the processing vessel. A trailing diffuser 62 is mounted on the carrier end intended to trail during the entry of the carrier into the processing vessel. The trailing diffuser is oriented to discharge a laminar flow of gas away from the workpiece and toward the workpiece opening in the processing vessel when the carrier is within the vessel, thereby preventing the entry of air into the vessel. Alternatively the trailing diffuser discharges a laminar flow towards the workpieces. In yet another variant, the diffuser discharges flow from both its faces.

The means for supporting and transporting the carrier comprises an arm extending from the carrier end intended to trail during entry of the carrier into the processing vessel. Mounted on the arm near the trailing end of the carrier is an end plate 38 sized to at least partially close the opening 12 in the processing vessel when the carrier is within the vessel, thereby reducing the consumption of selected gas.

Figure 7:
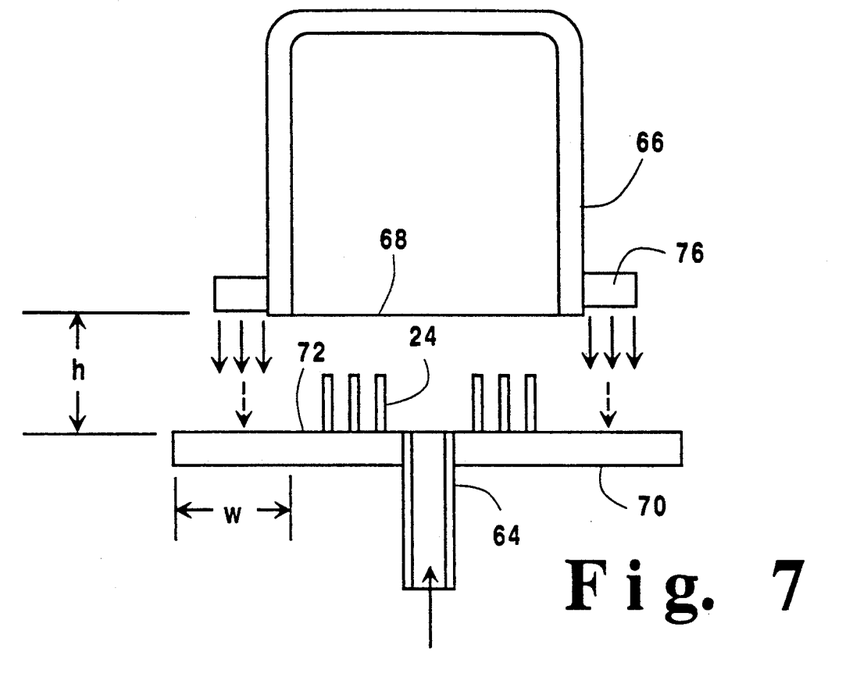
FIG. 7 and FIG. 8 are vertical sectional views of other embodiments of the invention wherein the normally separable components of the apparatus are shown separated.

Yet another embodiment depicted in FIG. 7 comprises a processing vessel 66 which may take the form of a bell jar having a large opening 68 for the admission of the workpiece 24. To suit requirements, work may be oriented vertically or horizontally on a mating workpiece carrier plate 70 which has a surface 72 for mating with the opening 68 in the processing vessel 66. A port 64 is provided within the workpiece carrier plate 70 so that selected gas may be admitted into the processing vessel during the time that the vessel and the carrier plate are mated. Common means are used to bring and to retain the processing vessel and the carrier mating surface into coincidence.

This type of apparatus is used, for example, to grow epitaxial layers of silicon on silicon wafers. Ordinarily during loading, the internal surfaces of the bell jar and the carrier plate are exposed to atmospheric air allowing atmospheric moisture to absorb thereon. During the processing of the work, the moisture desorbs from the interior surfaces and impairs the work, e.g., causing stacking faults, haze and other film property defects.

According to this invention, the processing vessel 66 at its opening 68 is provided with an annular diffuser 76 oriented to discharge a laminar curtain flow approximately normal to the opening 68 and away from the processing vessel 66. Prior to opening the processing vessel, the diffuser flow is started. The workpiece carrier plate is then moved a short distance from the vessel and kept within the diffuser flow. Atmospheric air is excluded from the internal processing surfaces by the curtain flow of selected gas allowing unloading and loading of the carrier plate 70 without detrimental effect. Upon completion of loading or unloading, the plate 70 and vessel 66 are mated, diffuser flow is ceased and processing is begun.

As depicted in FIG. 7, the workpiece carrier plate preferably extends a distance w beyond the inner boundary of the diffuser so that w is at least equal to the distance h which is the maximum separation between the bell jar and the carrier plate during operation of the apparatus.

Figure 8:
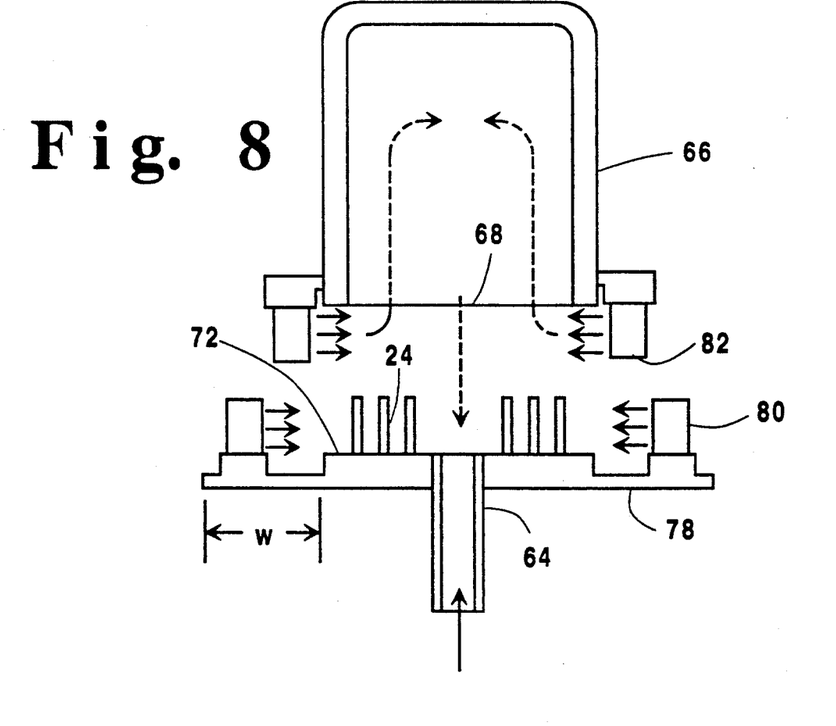

Another embodiment is shown in FIG. 8, comprising a processing vessel 66 which may take the form of a bell jar. The workpiece carrier 78 has an annular diffuser 80 with an emitting surface oriented to discharge a laminar flow of selected gas radially inward at the workpiece. This laminar flow replaces atmospheric air contacting the workpiece surface with selected gas. The processing vessel 66 has an annular diffuser 82 mounted adjacent to its opening 68. This diffuser is oriented to discharge a laminar flow of selected gas across the opening to the processing vessel thereby filling the vessel with selected gas and impeding the entrance of air from the atmosphere. When the workpiece carrier 78 and the processing vessel 66 are in coincidence, the diffuser flows are ceased. The flow from the diffusers are initiated prior to separation of the carrier from the processing vessel, thereby allowing unloading and loading without exposing the internal surfaces to atmospheric air.

A dimensionless parameter which is useful as a criterion of dynamic similarity for a fluid curtain is a modified Froude number. This parameter is analogous to a nondimensionalized or normalized flow velocity, and can be used to describe the requirements for establishing an effective laminar fluid curtain. Laminar flow is considered to exist when the root mean square of random fluctuations in fluid velocity does not exceed 10% of the average fluid velocity. The modified Froude number F as used herein is defined as:

$$F = \frac{Q}{A} \sqrt{\frac{\rho_e}{(\rho_a - \rho_v)gt}}$$

where Q is the total volumetric flow rate of fluids provided to the diffusers to establish the curtain A is the area covered by the curtain, $\rho_e$ is the mass density of the fluids emitted by the diffusers, $\rho_a$ is the density of the atmospheric air contiguous with the curtain, $\rho_v$ is the density of the gas within the free volume of the vessel, g is the acceleration of gravity, and t is the thickness of the curtain at its origin.

In all of the embodiments, the emitting surface of each diffuser positioned at a vessel opening desirably has a transverse width or diameter at least 5% of the distance over which the curtain provided by the diffuser is intended to extend. Also comprising the apparatus of each embodiment is a means for controlling the flow of selected gas from each such diffuser so that desirably it will issue at a modified Froude number in the range of from about 0.05 to about 10. With the selected gas provided by a pressurized source, the control means may take the form of a valve or pressure regulator. The pressure within each diffuser is regulated to a preset value which will provide the desired flow and desired modified Froude number.

The construction of a diffuser positioned at a vessel opening as used in this invention may comprise a channel with a porous emitting face. The porous face may be a sintered metal sheet with a pore size ranging from about 0.5 microns to about 50 microns and preferably from about 2 microns to about 5 microns. Nonmetallic media such as porous plastic or fritted quartz are also usable. For semiconductor and integrated circuit processing, the porous material provides an added benefit in that it filters the emitted gas of detrimental particulate matter.

A preferred diffuser construction comprises a hollow tubular body with an inlet for fluid into the hollow and a perforated wall for emitting fluid. The tubular body is contained in an elongated housing or channel having an outlet running substantially the length of the housing. A channel having a U-shaped cross section is an example. The housing extends substantially the length of the tubular body. The housing outlet directs a curtain of fluid from the housing across the opening to a contained volume desired to have a selected atmosphere. The height of the housing outlet is at least 5% of the distance the fluid curtain is intended to extend. A screen across the housing outlet disperses the flow from the housing and protects the porous body within the housing from damage by external objects.

One end of the tubular body preferably has a cylindrical support which passes through and is supported by an end wall of the housing. The other end of the tubular body has the fluid inlet which passes through and is supported by the other end wall of the housing.

The perforations in the tubular body are fine, preferably so that the wall of the tubular body comprises a porous wall. The pore size is from about 0.5 microns to about 100 microns, preferably from about 2 microns to about 50 microns. In operation, flow is controlled to issue from the porous tube in a laminar state with a modified Froude number of from about 0.05 to about 10.

The screen may be any perforated surface which produces little pressure drop and protects the diffuser against damage by external objects. Wire mesh with from 1 to 50 openings per centimeter functions well. The mesh covers the housing outlet and the edges of the mesh bend around the housing without any additional sealing requirement to the housing. Surprisingly the screen improves the overall performance of a diffuser in excluding air from entering an opening to a protected volume. In addition to mesh, perforated plates and sintered metal surfaces are usable. Any of these surfaces can be mounted to the housing by the technique described, or by other common techniques such as flush or inlaid mounting, for example.

Although the invention has been described with reference to specific embodiments, it will be appreciated that it is intended to cover all modifications and equivalents within the scope of the appended claims.

What is claimed is:

1. An apparatus for processing a workpiece/in a selected atmosphere, said apparatus comprising:
   (a) a processing vessel having:
      (1) an opening for entry of the workpiece;
      (2) a diffuser with an emitting surface oriented to emit a laminar curtain flow of selected gas across said processing vessel opening;
   (b) a preparation vessel having:
      (1) an opening congruent with said processing vessel opening; and
      (2) a diffuser with an emitting surface oriented to emit a laminar curtain flow of selected gas across said preparation vessel opening;
   (c) means for bringing said preparation vessel opening and said processing vessel opening into coincidence;
   (d) a workpiece carrier; and
   (e) means for transferring said workpiece carrier from said preparation vessel to said processing vessel when said preparation vessel opening and said processing vessel opening are in coincidence.

2. The apparatus as in claim 1 wherein said diffusers have emitting surfaces with a transverse width at least 5% of the distance the curtains are intended to extend, and further comprising means for controlling gas to issue from said emitting surfaces at a modified Froude number in the range of from about 0.05 to about 10.

3. The apparatus as in claim 1 further comprising an inlet for selected gas in said processing vessel, said inlet located remote from said vessel opening.

4. The apparatus as in claim 1 further comprising an inlet for selected gas in said preparation vessel, said inlet located remote from said vessel opening, said inlet comprising a carrier-arm tube mounted in an end wall of said preparation vessel, one end of said carrier-arm tube protruding from about 0.1 to about 3 carrier-arm tube diameters into said preparation vessel, and the other end protruding from about 2 to about 10 carrier-arm tube diameters outside of said preparation vessel, said carrier-arm tube having an entry for selected gas, and wherein said means for transferring a workpiece from said preparation vessel to said processing vessel includes said carrier-arm passing through said carrier-arm tube.

5. The apparatus as in claim 1 further including a barrier to gas flow between said diffusers and said vessels.

6. The apparatus as in claim 1 wherein said diffusers are annular and encircle said vessel openings.

7. The apparatus as in claim 1 further comprising an end plate for at least partially closing said processing vessel opening and means for positioning said end plate at said processing vessel opening when the workpiece is in said processing vessel.

8. The apparatus as in claim 1 further comprising a diffuser exhaust gas collector about said processing vessel diffuser.

9. The apparatus as in claim 8 further comprising a withdrawal port in said collector, said port having a flow resistive media so that when said collector is installed on said vessel, said flow resistive media has a frontal area extending over a 45° angle lying in the plane of the vessel opening with its vertex at the center of the vessel opening.

10. The apparatus as in claim 1 further comprising a diffuser exhaust gas collector about said preparation vessel diffuser.

11. The apparatus as in claim 1 further comprising a diffuser within said processing vessel, said diffuser located remote to said processing vessel opening, connected to receive selected gas, oriented to emit gas toward the intended workpiece location and said processing vessel opening, and having an emitting surface for issuing a laminar flow of gas.

12. The apparatus as in claim 1 further comprising a diffuser within said preparation vessel, said diffuser located remote to said preparation vessel opening, connected to receive selected gas, oriented to emit gas toward the intended workpiece location and said preparation vessel opening, and having an emitting surface for issuing a laminar flow of gas.

13. An apparatus for providing a selected atmosphere for processing of a workpiece, said apparatus comprising:

(a) a processing vessel having an opening for entry of the workpiece;

(b) a diffuser located within said processing vessel remote from said opening, said diffuser oriented to discharge at a location intended for the workpiece during processing, said diffuser having an emitting surface for issuing a laminar flow of gas;

(c) a workpiece carrier for retaining and carrying the workpiece into the opening into said processing vessel;

(d) means for supporting and transporting said carrier into said processing vessel; and (e) a trailing diffuser mounted on the carrier end intended a trail during entry of said carrier into said processing vessel, said diffuser sized to fit within said processing vessel and having an emitting surface for issuing a laminar flow of gas directed at the intended workpiece location, or directed away from the intended workpiece location, or both toward and away from the intended workpiece location.

14. The apparatus as in claim 13 further comprising an end plate mounted on the end of said carrier intended to trail during entry into said processing vessel, said end plate sized to at least partially close the opening in said processing vessel.

15. An apparatus for providing a selected atmosphere for processing of a workpiece, said apparatus comprising:

(a) a processing vessel having an opening for entry of the workpiece;

(b) a workpiece carrier for retaining and carrying the workpiece through the opening into said processing vessel;

(c) means for supporting and transporting said carrier;

(d) a leading diffuser mounted on the carrier end intended to lead the entry of said carrier into said processing vessel, said diffuser having an emitting surface for issuing a laminar flow of gas directed at, or away from, or both at and away from the intended workpiece location;

(e) a trailing diffuser mounted on the carrier end intended to trail during entry of said carrier into said processing vessel, said diffuser having an emitting surface for issuing a laminar flow of gas directed at, or away from, or both at and away from the intended workpiece location.

16. The apparatus as in claim 15 wherein said means for supporting and transporting said carrier comprises an arm extending from said carrier end intended to trail during entry of said carrier into said processing vessel, and further comprising an end plate mounted on the end of said carrier proximate said arm, said end plate sized to at least partially close the opening in said processing vessel.

17. An apparatus for processing a in a selected atmosphere within a processing vessel, said apparatus comprising:

(a) a workpiece carrier plate having;
 (1) a surface for mating with an opening in said processing vessel; and
 (2) a discharge for selected gas;

(b) said processing vessel having:
 (1) said opening for the workpiece; and
 (2) a diffuser surrounding said opening, said diffuser oriented to discharge a laminar curtain flow of selected fluid approximately normal to said opening and away from said processing vessel towards said workpiece carrier; and (c) means for bringing said processing vessel opening and said carrier mating surface into coincidence.

18. The apparatus as in claim 17 wherein said workpiece carrier plate extends a distance beyond the inner boundary of the diffuser at least equal to the intended maximum operating separation of the carrier plate sealing surface and the vessel opening.

19. An apparatus for processing a workpiece in a selected atmosphere, said system comprising:

(a) a processing vessel having:
 (1) an opening for the workpiece;
 (2) a diffuser oriented to issue laminarly a curtain flow of selected gas across said processing vessel opening;

(b) a workpiece carrier plate having:
 (1) a surface for mating with said processing vessel opening;
 (2) a diffuser with an emitting surface oriented to issue a laminar flow of selected gas across the workpiece carrier plate at the intended workpiece location; and (c) means for bridging said preparation vessel opening and said carrier plate mating surface into coincidence with both of said diffusers outside said processing vessel opening and with said intended workpiece location within said processing vessel opening.

20. The apparatus as in claim 19 wherein said emitting surfaces each have a transverse width at least 5% of the distance over which each said curtain is intended to extend, and further comprising means for controlling the flow of selected gas from each of said diffusers to issue at a modified Froude number in the range of from about 0.05 to about 10.

21. A method for providing a selected atmosphere for processing of a workpiece in a processing vessel having an opening for receiving the workpiece and a preparation vessel having an opening congruent with the processing vessel opening, said method comprising:

(a) placing the workpiece in said preparation vessel;

(b) flowing a laminar curtain of selected gas across said preparation vessel opening;

(c) flowing a laminar curtain of selected gas across said processing vessel opening;

(d) bringing said preparation vessel opening into coincidence with said processing vessel opening; and (e) transferring the workpiece from said preparation vessel into said processing vessel.

22. The method of claim 21 further comprising the step of issuing laminarly in the processing vessel a flow of selected gas at the intended workpiece location and toward said opening for the workpiece.

23. The method as in claim 21 wherein said steps of flowing laminar curtain flows comprise issuing curtain flows of selected gas at a modified Froude number of from about 0.05 to about 10.

24. A method for providing a selected atmosphere for processing of a workpiece on a workpiece carrier for carrying the workpiece into a processing vessel having an opening for entry of said carrier, said method comprising:

(a) transporting said carrier into said processing vessel;

(b) issuing laminarly a curtain flow of selected gas across the workpiece so as to envelop the workpiece and substantially exclude the surrounding air from the external surfaces of the workpiece; and (c) issuing laminarly from a diffuser mounted on the trailing end of said carrier a flow of selected gas in a direction substantially away from the workpiece, or toward the workpiece, or both toward and away from the workpiece.

25. The method as in claim 24 further comprising the step of at least partially closing said processing vessel opening with an end plate upon transporting said workpiece carrier into said processing vessel.

26. A method for providing a selected atmosphere for processing of a workpiece on a workpiece carrier for carrying the workpiece into a processing vessel having an opening for entry of said carrier, said method comprising:

(a) issuing laminarly a flow of selected gas at the workpiece so as to envelop the workpiece and substantially exclude surrounding air from the external surfaces of the workpiece;

(b) transporting said carrier into said processing vessel; and (c) issuing laminarly from a diffuser mounted on the trailing end of said carrier a flow of selected gas in a direction substantially away from the workpiece, or at the workpiece, or both at and away from the workpiece.

27. The method as in claim 26 further comprising the step of at least partially closing said processing vessel opening with an end plate upon transporting said workpiece carrier into said processing vessel.

28. The method as in claim 27 further comprising the step of issuing laminarly a curtain flow of selected gas across said processing vessel opening at a modified Froude number in the range of from about 0.05 to about 10 so as to enter the opening, purge the processing volume of said processing vessel and impede the infiltration of surrounding air into said opening, and wherein said workpiece carrier is mounted on said end plate, said end plate having a surface for mating with said processing vessel opening, and said step of transporting said carrier into said processing vessel comprises bringing said preparation vessel opening and said end plate mating surface into coincidence.

29. A method for providing in a processing vessel a selected atmosphere for processing of a workpiece on a workpiece carrier plate having a workpiece location and a surface for mating with an opening to said processing vessel, said method comprising:

(a) issuing laminarly from a diffuser surrounding said opening a curtain flow of selected gas in a direction approximately normal to and away from said opening;

(b) placing said carrier workpiece location within the curtain flow emanating from said diffuser;

(c) placing the workpiece in said carrier workpiece location;

(d) bringing said processing vessel opening and said carrier plate mating surface into coincidence; and (e) discharging selected gas into said processing vessel.

* * * * *